(12) United States Patent
Kim

(10) Patent No.: US 8,232,570 B2
(45) Date of Patent: Jul. 31, 2012

(54) SEMICONDUCTOR LIGHT EMITTING DEVICE HAVING CONDUCTIVE SUBSTRATE

(75) Inventor: Kyung Jun Kim, Gwangju (KR)

(73) Assignee: LG Innotek Co., Ltd., Seoul (KR)

( * ) Notice: Subject to any disclaimer, the term of this patent is extended or adjusted under 35 U.S.C. 154(b) by 413 days.

(21) Appl. No.: 12/144,435

(22) Filed: Jun. 23, 2008

(65) Prior Publication Data

US 2008/0315225 A1    Dec. 25, 2008

(30) Foreign Application Priority Data

Jun. 21, 2007  (KR) .................. 10-2007-0060936

(51) Int. Cl.
  *H01L 33/00*   (2010.01)
  *H01L 29/06*   (2006.01)
  *H01L 31/00*   (2006.01)
  *H01L 27/15*   (2006.01)
  *H01L 29/26*   (2006.01)
  *H01L 31/12*   (2006.01)

(52) U.S. Cl. ............... 257/96; 257/13; 257/14; 257/79; 257/94; 257/95; 257/97; 257/E33.028; 257/E33.03

(58) Field of Classification Search .......... None
See application file for complete search history.

(56) References Cited

U.S. PATENT DOCUMENTS

| | | | | |
|---|---|---|---|---|
| 5,406,574 A | * | 4/1995 | Rennie et al. | 372/45.01 |
| 5,488,233 A | * | 1/1996 | Ishikawa et al. | 257/94 |
| 5,619,523 A | * | 4/1997 | Connolly et al. | 372/96 |
| 7,078,735 B2 | * | 7/2006 | Shono et al. | 257/98 |
| 7,138,648 B2 | * | 11/2006 | Kneissl et al. | 257/14 |
| 2005/0110029 A1 | * | 5/2005 | Aoyagi et al. | 257/94 |
| 2005/0221521 A1 | * | 10/2005 | Lee et al. | 438/29 |
| 2005/0221526 A1 | * | 10/2005 | Cho et al. | 438/41 |
| 2006/0006407 A1 | * | 1/2006 | Kim et al. | 257/103 |
| 2006/0226431 A1 | * | 10/2006 | Lee et al. | 257/79 |
| 2007/0096077 A1 | * | 5/2007 | Sanga et al. | 257/13 |
| 2007/0105256 A1 | * | 5/2007 | Fitzgerald | 438/34 |
| 2007/0241350 A1 | * | 10/2007 | Kim | 257/90 |

* cited by examiner

*Primary Examiner* — Nathan Ha
*Assistant Examiner* — Michael Jung
(74) *Attorney, Agent, or Firm* — Birch, Stewart, Kolasch & Birch, LLP

(57) ABSTRACT

Provided are a semiconductor light emitting device and a method of manufacturing the same. The semiconductor light emitting device comprises a p-type substrate, a p-type semiconductor layer, an active layer, and an n-type semiconductor layer. The p-type semiconductor layer is formed on the p-type substrate. The active layer is formed on the p-type semiconductor layer. The n-type semiconductor layer is formed on the active layer.

19 Claims, 1 Drawing Sheet

SEMICONDUCTOR LIGHT EMITTING DEVICE HAVING CONDUCTIVE SUBSTRATE

CROSS-REFERENCE TO RELATED APPLICATIONS

The present application claims priority under 35 U.S.C. 119 and 35 U.S.C. 365 to Korean Patent Application No. 10-2007-0060936 (filed on Jun. 21, 2007).

BACKGROUND

A III-V group nitride semiconductor has been variously used for an optical device such as blue/green light emitting diodes (LEDs), a high speed switching device such as a metal semiconductor field effect transistor (MOSFET) and a hetero junction filed effect transistor (HEMT), a light source of an illumination or a display apparatus, and the like. In particular, a light emitting device using an III group nitride semiconductor has a direct transition-type bandgap corresponding to the range of visible rays to ultraviolet rays, and can perform high efficient light emission.

The nitride semiconductor has been mainly utilized as a LED or a laser diode (LD), and research for improving the manufacturing process or light efficiency has been conducted.

SUMMARY

Embodiments provide a semiconductor light emitting device that can form a nitride semiconductor using a p-type substrate.

Embodiments provide a semiconductor light emitting device comprising a p-type substrate and at least one p-type semiconductor layer formed on the p-type substrate.

An embodiment provides a semiconductor light emitting device comprising: a p-type substrate; a p-type semiconductor layer on the p-type substrate; an undoped semiconductor layer on the p-type semiconductor layer; an active layer on the undoped semiconductor layer; and an n-type semiconductor layer on the active layer.

An embodiment provides a semiconductor light emitting device comprising: a p-type conductive substrate; a p-type semiconductor layer comprising at least two layers on the p-type conductive substrate; an active layer on the p-type semiconductor layer; and an n-type semiconductor layer on the active layer.

An embodiment provides a semiconductor light emitting device comprises: a semiconductor substrate; a p-type semiconductor layer comprising a first nitride semiconductor layer doped with a p-type dopant having a different concentration on the semiconductor substrate; an undoped semiconductor layer on the p-type semiconductor layer; an active layer on the undoped semiconductor layer; and an n-type semiconductor layer on the active layer.

The details of one or more embodiments are set forth in the accompanying drawings and the description below. Other features will be apparent from the description and drawings, and from the claims.

DETAILED DESCRIPTION OF THE EMBODIMENTS

Hereinafter, a semiconductor light emitting device according to an embodiment will be described with reference to the accompanying drawings.

Figure 1:
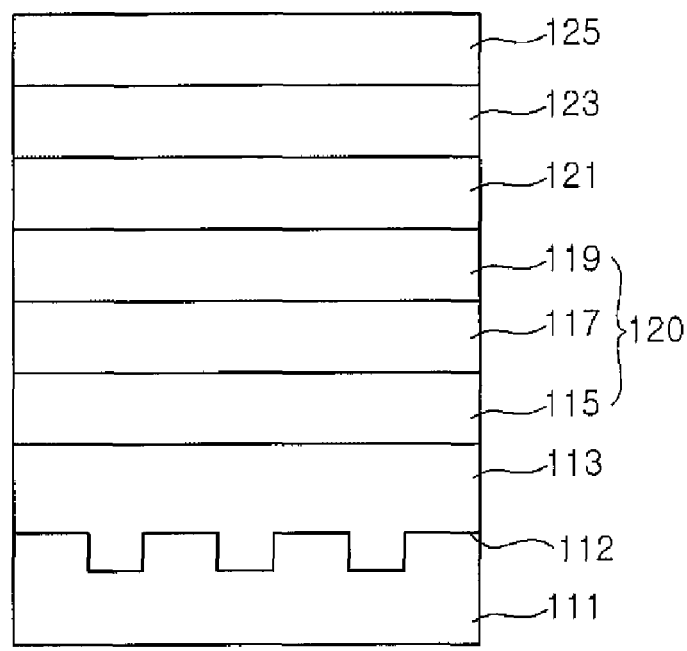
FIG. 1 is a side cross-sectional view of a semiconductor light emitting device according to a first embodiment.

FIG. 1 is a side cross-sectional view of a semiconductor light emitting device according to a first embodiment.

Referring to FIG. 1, a semiconductor light emitting device 100 comprises a p-type substrate 111, a buffer layer 113, a p-type semiconductor layer 120, an undoped semiconductor layer 121, an active layer 123, and an n-type semiconductor layer 125.

The p-type substrate 111 comprises a semiconductor substrate having p-type characteristics. Also, the p-type substrate 111 comprises at least one of Si, SiC, GaN, Ge, and GaAs substrates that are doped with dopant containing divalent elements. A conductive substrate may be used for the p-type substrate 111.

A concave-convex pattern 112 is formed in the p-type substrate 111. The concave-convex pattern 112 may be formed using a dry etching process and/or a wet etching process. The concave-convex pattern 112 can improve quality of a thin film formed on the p-type substrate 111. Each of convex patterns of the concave-convex pattern 112 may have one of stripe, mesa, lens, polygonal pillar, cylindrical, and polygonal cone shapes. The concave-convex patterns 112 may be spaced a predetermined distance or a random distance.

Each of the convex patterns of the concave-convex pattern 112 may have a width or length ranging from about 300 nm to about 10 um and a height ranging from about 0.5 um to about 5 um. In the embodiment, the patterns may not be formed on the p-type substrate, and the present disclosure is not limited to a shape or size of the patterns.

The buffer layer 113 is formed on the p-type substrate 111. The buffer layer 113 may comprise an $Al_xGa_{1-x}N$ ($0 \leq x \leq 1$) layer, and may be doped with p-type dopant.

A thin film formed of $Al_xGa_{1-x}N$ ($0 \leq X \leq 1$) may be grown to a thickness ranging from about 100 nm to about 1000 nm at a temperature atmosphere ranging from about 900° C. to about 1200° C. to form the buffer layer 113. The buffer layer 113 may be doped with the p-type dopant ranging from about 10 sccm to about 500 sccm (standard cubic centimeter per minute). The buffer layer 113 is not limited to an AlGaN or GaN thin film, and may be formed of InN, AlN, InGaN, InAlGaN, and AlInN.

The p-type semiconductor layer 120 is formed on the buffer layer 113. The p-type semiconductor layer 120 may comprise the $Al_xGa_{1-x}N$ ($0 \leq X \leq 1$) layer. The p-type semiconductor layer 120 is not limited to the AlGaN or GaN thin film, and may be formed of InN, AlN, InGaN, InAlGaN, and AlInN.

The p-type semiconductor layer 120 may comprise a single layer or multilayer, and serves as a clad layer. When the p-type semiconductor layer 120 has the multilayer structure, the multilayer structure may be provided by adjusting a doping concentration of the p-type dopant. For example, the p-type dopant may be lightly doped into an upper p-type nitride layer 119 than a lower p-type nitride layer 115. Each of nitride layers may be doped with different doping concentrations.

For example, when the p-type semiconductor layer 120 comprises three layers, a first nitride layer 115, a second nitride layer 117, and a third nitride layer 119 may be sequentially formed.

The first nitride layer 115 comprises the $Al_xGa_{1-x}N$ ($0 \leq x \leq 1$) layer on the buffer layer 113. For example, the first nitride layer 115 is grown to a thickness ranging from about 20 nm to about 500 nm at a temperature ranging from about 800° C. to about 1000° C. The first nitride layer 115 may be doped with the p-type dopant ranging from about 500 sccm to about 2000 sccm.

The second nitride layer 117 comprises the $Al_xGa_{1-x}N$ ($0 \leq X \leq 1$) layer on the first nitride layer 115. For example, the second nitride layer 117 is grown to a thickness ranging from about 20 nm to about 500 nm at a temperature ranging from about 800° C. to about 1000° C. The second nitride layer 117 may be doped with the p-type dopant ranging from about 300 sccm to about 1500 sccm.

The third nitride layer 119 comprises the $Al_xGa_{1-x}N$ ($0 \leq X \leq 1$) layer on the second nitride layer 117. For example, the third nitride layer 119 is grown to a thickness ranging from about 20 nm to about 500 nm at a temperature ranging from about 800° C. to about 1000° C. The third nitride layer 119 may be doped with the p-type dopant ranging from about 100 sccm to about 1000 sccm.

The p-type semiconductor layer 120 may comprise at least one layer of the first, second, and third nitride layers 115, 117, and 119. The number of layers and growth conditions may be changed.

The first, second, and third nitride layers 115, 117, and 119 may be doped with elements such as Mg, Zn, Ca, Sr, Ba, and Be as the p-type dopant. With a growth decreasing toward the third nitride layer 119 from the first nitride layer 115, a doping concentration of the p-type dopant is reduced by degrees.

After the p-type semiconductor layer 120 comprising the first, second, and third nitride layers 115, 117, and 119 is grown, an annealing process is performed. The annealing process may be performed during an in-situ process, or may be performed outside a chamber after thin film growth is completed. When the annealing process is performed during the in-situ process, the annealing process may be performed after each of first, second, and third nitride layers 115, 117, and 119 is grown or after the p-type semiconductor layer 120 comprising the first, second, and third nitride layers 115, 117, and 119 is all grown. The annealing process may be performed within or outside the chamber for a time between several minutes to twenty minutes in an $N_2$ gas atmosphere at a temperature of about 400° C. to about 700° C. The annealing process may reduce a resistance of the p-type semiconductor layer 120.

The undoped semiconductor layer 121 is formed on the p-type semiconductor layer 120. That is, the undoped semiconductor layer 121 is formed on the third nitride layer 119 of the p-type semiconductor layer 120. The undoped semiconductor layer 121 may comprise an undoped GaN layer, and the undoped semiconductor layer 121 is not doped by intent.

The active layer 123 is formed on the undoped semiconductor layer 121. The active layer 123 may comprise a single structure or a multi-quantum well (MQW) structure. For example, thin films formed of $In_xGa_{1-x}N/GaN$ ($0 \leq X \leq 1$) are respectively grown to a thickness ranging from about 10 Å to about 200 Å at a temperature atmosphere ranging from about 800° C. to about 100° C. to form the active layer 123.

The n-type semiconductor layer 125 is formed on the active layer 123. The n-type semiconductor layer 125 may comprise one of GaN, InN, AlN, InGaN, AlGaN, InAlGaN, and AlInN layers. At least one of Si, Ge, Se, and Te are added as the n-type dopant. For example, the n-type semiconductor layer 125 may be grown to a predetermined thickness at a temperature ranging from about 900° C. to about 1200° C. by supplying silane gas ($SiH_4$) comprising $NH_3$, TMGa (or TFGa), and Si.

The p-type substrate 111 may serve as a p-type electrode layer, or an additional electrode layer may be formed on or under the p-type substrate 111. An n-type electrode layer may be formed on the n-type semiconductor layer 125. A transparent electrode layer and the n-type electrode layer may be formed on the n-type semiconductor layer 125. The transparent electrode layer may be formed of one of ITO, ZnO, IrOx, RuOx, and NiO.

Figure 2:
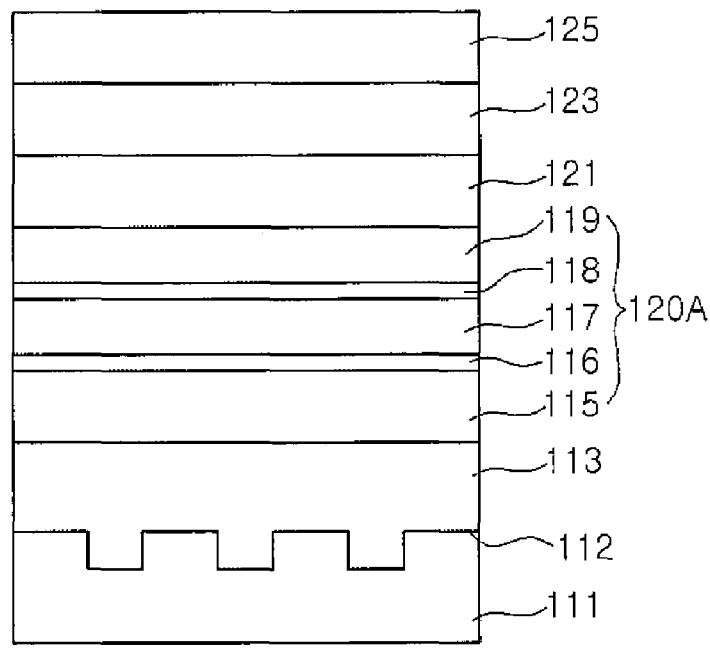
FIG. 2 is a side cross-sectional view of a semiconductor light emitting device according to a second embodiment.

FIG. 2 is a side cross-sectional view of a semiconductor light emitting device according to a second embodiment.

In descriptions of a second embodiment, same reference numerals are used for the same parts as those of the first embodiment, and descriptions thereof will be omitted.

Referring to FIG. 2, a semiconductor light emitting device 100A comprises a substrate 111, a buffer layer 113, a p-type semiconductor layer 120A, an undoped semiconductor layer 121, an active layer 123, and an n-type semiconductor layer 125.

The p-type semiconductor layer 120A comprises multi-layer nitride layers. A first to third nitride layers 115, 117, and 119 comprise a p-type $Al_xGa_{1-x}N$ ($0 \leq X \leq 1$) layer. A fourth nitride layer 116, i.e., an $In_y(Al_xGa_{1-x})_{1-y}N$ ($0 \leq X \leq 1$, $0 \leq y \leq 1$) layer is formed between the first nitride layer 115 and the second nitride layer 117. A fifth nitride layer 118, i.e., the $In_y(Al_xGa_{1-x})_{1-y}N$ ($0 \leq x \leq 1$, $0 \leq y \leq 1$) layer is formed between the second nitride layer 117 and the third nitride layer 119.

The fourth nitride layer 116 or the fifth nitride layer 118 comprises $In_y(Al_xGa_{1-x})_{1-y}N$ layer. The fourth nitride layer 116 or the fifth nitride layer 118 is grown to a thickness ranging from about 10 nm to about 100 nm at a temperature ranging from about 800° C. to about 1000° C. The fourth nitride layer 116 and the fifth nitride layer 118 can improve qualities of the nitride layers 117 and 119 growing thereon.

The fourth nitride layer 116 and the fifth nitride layer 118 may be doped with the p-type dopant. At least one of the fourth nitride layer 116 and the fifth nitride layer 118 may not be formed.

Although a compound semiconductor light emitting device having a P—N junction structure is used in the embodiment, the present disclosure is not limited thereto. For example, a compound semiconductor light emitting device having a P—N—P junction structure may be used. In the following description, it will be understood that when a layer (or film), a region, a pattern, or components is referred to as being 'on' or 'under' another substrate, layer (or film), region, or patterns, it can be directly on the other layer or substrate, or intervening layers may also be present.

Any reference in this specification to "one embodiment," "an embodiment," "example embodiment," etc., means that a particular feature, structure, or characteristic described in connection with the embodiment is comprised in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrange-

What is claimed is:

1. A semiconductor light emitting device comprising:
a p-type substrate;
a p-type semiconductor layer on the p-type substrate;
an undoped semiconductor layer on the p-type semiconductor layer;
an active layer including a multi-quantum well (MQW) structure on the undoped semiconductor layer; and
an n-type semiconductor layer on the active layer,
wherein the undoped semiconductor layer is disposed between the p-type semiconductor layer and the active layer, and the p-type semiconductor layer is disposed between a top surface of the p-type substrate and a lower surface of the undoped semiconductor layer,
wherein the p-type substrate is a supporting layer upon which the p-type semiconductor layer, the undoped semiconductor layer, the active layer and the n-type semiconductor layer are disposed in order,
wherein the p-type substrate comprises a concave-convex pattern, the concave-convex pattern is formed on the top surface of the p-type substrate,
wherein a lower surface of the p-type substrate is formed of a flat surface,
wherein the p-type substrate has a thickness thicker than a height of a concave pattern of the concave-convex pattern,
wherein the p-type semiconductor layer comprises nitride layers.

2. The semiconductor light emitting device according to claim 1, wherein the p-type substrate comprises at least one of Si, SiC, Ge, and GaAs substrates doped with a p-type dopant.

3. The semiconductor light emitting device according to claim 1, wherein the concave pattern or the convex pattern comprises at least one of stripe, mesa, lens, polygonal pillar, cylindrical, and polygonal cone shapes.

4. The semiconductor light emitting device according to claim 1, further comprising a buffer layer between the top surface of the p-type substrate and a lower surface of the p-type semiconductor layer,
wherein the buffer layer and the undoped semiconductor layer are formed of a nitride-based semiconductor layer
wherein the buffer layer has a thickness thinner than that of the p-type substrate, and
wherein the concave pattern of the concave-convex pattern has the height ranging from about 0.5 µm to about 5 µm.

5. The semiconductor light emitting device according to claim 4, wherein the buffer layer comprises an $Al_xGa_{1-x}N$ ($0 \leq X \leq 1$) layer doped with the p-type dopant and is electrically connected to the p-type substrate and the p-type semiconductor layer.

6. The semiconductor light emitting device according to claim 4, wherein the buffer layer is physically contacted with the top surface of the p-type substrate and a lower surface of the p-type semiconductor layer.

7. The semiconductor light emitting device according to claim 1, wherein the p-type semiconductor layer comprises nitride layers in which each of the nitride layers is doped with the p-type dopant having different doping concentrations.

8. The semiconductor light emitting device according to claim 1, wherein an amount of the p-type dopant doped into the nitride layers is reduced toward the active layer from the p-type substrate.

9. The semiconductor light emitting device according to claim 1, wherein each of the nitride layers of the p-type semiconductor layer is formed a thickness ranging from about 20 nm to about 500 nm.

10. The semiconductor light emitting device according to claim 1, comprising at least one p-type $In_y(AlGa_{1-x})_{1-y}N$ ($0 \leq x \leq 1$, $0 \leq y \leq 1$) layer between the nitride layers of p-type semiconductor layer.

11. A semiconductor light emitting device comprising:
a p-type conductive substrate including a dopant of divalent elements;
a p-type semiconductor layer comprising at least two layers with different dopant concentrations on the p-type conductive substrate;
an active layer on the p-type semiconductor layer; and
an n-type semiconductor layer on the active layer,
wherein the p-type conductive substrate is a supporting layer upon which the p-type semiconductor layer, the active layer and the n-type semiconductor layer are disposed in order,
wherein the p-type semiconductor layer is disposed between a top surface of the p-type conductive substrate and a lower surface of the active layer,
the p-type conductive substrate is electrically connected to the p-type semiconductor layer,
wherein the p-type conductive substrate comprises a concave-convex pattern, the concave-convex pattern is formed on the top surface of the p-type conductive substrate,
wherein an entire lower surface of the p-type conductive substrate is formed of a flat surface,
wherein the p-type conductive substrate has a thickness thicker than a height of a concave pattern of the concave-convex pattern,
wherein the p-type semiconductor layer comprises nitride layers.

12. The semiconductor light emitting device according to claim 11, comprising a buffer layer between the p-type conductive substrate and the p-type semiconductor layer, and the buffer layer comprising at least one of AlGaN, GaN, InN, AlN, InGaN, InAlGaN, and AlInN layers,
wherein a portion of the buffer layer is physically contacted with a surface of the concave pattern.

13. The semiconductor light emitting device according to claim 11, wherein the p-type semiconductor layer comprises an $Al_xGa_{1-x}N$ ($0 \leq X \leq 1$) layer and the p-type dopant concentration doped into the p-type semiconductor layer is reduced toward the active layer from the p-type conductive substrate.

14. The semiconductor light emitting device according to claim 11, wherein the p-type semiconductor layer comprises $Al_xGa_{1-x}N$ ($0 \leq X \leq 1$) layers and an $In_y(Al_xGa_{1-x})_{1-y}N$ ($0 \leq X \leq 1$, $0 \leq y \leq 1$) layer formed between the $Al_xGa_{1-x}N$ ($0 \leq X \leq 1$) layers.

15. A semiconductor light emitting device comprising:
a p-type semiconductor substrate including a Si-based substrate;
a p-type semiconductor layer comprising at least two nitride semiconductor layers which have different dopant concentrations from each other on the p-type semiconductor substrate, wherein the p-type semiconductor layer includes a p-type dopant;
an undoped semiconductor layer on the p-type semiconductor layer;
an active layer including a multi-quantum well (MQW) structure on the undoped semiconductor layer; and
an n-type semiconductor layer on the active layer, wherein the p-type semiconductor substrate is a supporting layer upon which the p-type semiconductor layer, the undoped semiconductor layer, the active layer and the n-type semiconductor layer are disposed in order, wherein the p-type semiconductor layer is disposed between a top surface of the p-type semiconductor substrate and a lower surface of the undoped semiconductor layer, wherein the p-type semiconductor substrate comprises a concave-convex pattern, the concave-convex pattern is formed on the top surface of the p-type semiconductor substrate, and wherein the p-type semiconductor substrate has a thickness thicker than a height of a concave pattern of the concave-convex pattern.

16. The semiconductor light emitting device according to claim 15, wherein the p-type semiconductor layer comprises a first nitride semiconductor layer and a second nitride semiconductor layer on the first nitride semiconductor layer, wherein the second nitride semiconductor layer has the p-type dopant concentration less than that of the first nitride semiconductor layer.

17. The semiconductor light emitting device according to claim 16, wherein the p-type semiconductor layer comprises an $In_y(Al_xGa_{1-x})_{1-y}N$ ($0 \leq X \leq 1$, $0 \leq y \leq 1$) layer between the first nitride semiconductor layer and the second nitride semiconductor layer, and wherein a thickness of the $In_y(Al_xGa_{1-x})_{1-y}N$ ($0 \leq X \leq 1$, $0 \leq y \leq 1$) layer is thinner than that of at least one of the first nitride semiconductor layer and the second nitride semiconductor layer.

18. The semiconductor light emitting device according to claim 15, wherein each of the convex pattern of the concave-convex pattern has a width ranging from about 400 nm to about 10 μm and the height ranging from about 0.5 μm to about 5 μm.

19. The semiconductor light emitting device according to claim 18, further comprising an $Al_xGa_{1-x}N$ ($0 \leq X \leq 1$) layer doped with the p-type dopant, the $Al_xGa_{1-x}N$ ($0 \leq X \leq 1$) layer is physically contacted with the top surface of the semiconductor substrate and a lower surface of the p-type semiconductor layer.

* * * * *